United States Patent [19]

Tschang et al.

[11] Patent Number: 4,940,609

[45] Date of Patent: Jul. 10, 1990

[54] POLYMERIC CONDITIONER FOR PRETREATING NONMETALLIC SURFACES FOR CHEMICAL METALLIZATION

[75] Inventors: Chung-Ji Tschang, Bad Durkheim; Johannes P. Dix, Neuhofen; Ekhard Winkler, Mutterstadt; Guenther Gotsmann, Frankenthal; Klaus Glaser, Mutterstadt; Rolf Fikentscher, Ludwigshafen, all of Fed. Rep. of Germany

[73] Assignee: BASF Aktiengesellschaft, Ludwigshafen, Fed. Rep. of Germany

[21] Appl. No.: 288,622

[22] Filed: Dec. 22, 1988

[51] Int. Cl.$^5$ .............................................. C23C 26/00
[52] U.S. Cl. .................................. 427/304; 427/305; 427/306
[58] Field of Search .................... 427/304, 305, 306

[56] References Cited

U.S. PATENT DOCUMENTS

| | | |
|---|---|---|
| 3,684,572 | 8/1972 | Taylor . |
| 3,960,904 | 6/1976 | Nysted ................................ 514/925 |
| 4,126,468 | 11/1978 | Kitteridge ........................... 427/304 |
| 4,204,013 | 5/1980 | Arcilesi .............................. 427/304 |
| 4,478,883 | 10/1984 | Bupp et al. . |
| 4,517,254 | 5/1985 | Grapentin ........................... 427/306 |
| 4,554,182 | 11/1985 | Bupp .................................. 427/305 |
| 4,634,468 | 1/1987 | Gulla ................................. 427/304 |
| 4,781,990 | 11/1988 | Grapentin ........................... 427/306 |
| 4,792,645 | 12/1988 | Nakao ................................ 427/305 |
| 4,847,114 | 7/1989 | Brasch ................................ 427/96 |

FOREIGN PATENT DOCUMENTS 1116408 6/1968 United Kingdom .
2154251 9/1985 United Kingdom .

*Primary Examiner*—Shrive Beck
*Assistant Examiner*—Vi Duong Dang
*Attorney, Agent, or Firm*—Oblon, Spivak, McClelland, Maier & Neustadt

[57] ABSTRACT

Certain quaternary salts of di- and/or tri-(alkanol)-amines, which salts are soluble in the aqueous bath employed, are used as conditioners for pretreating non-metallic surfaces of moldings prior to their activation for subsequent chemical metallization.

Outstandingly uniform and strongly adhering metal coatings are obtained in this manner.

12 Claims, No Drawings

POLYMERIC CONDITIONER FOR PRETREATING NONMETALLIC SURFACES FOR CHEMICAL METALLIZATION

The present invention relates to the use of salts of polycondensates containing quaternary groups and obtained from di- and/or tri-(alkanol)-amines as conditioners for pretreating nonmetallic surfaces of moldings prior to their activation for subsequent complete and uniform metallization.

The chemical metallization of the surface of nonmetallic materials is used, as a rule, to achieve a decorative effect, to protect the material surface or to impart electrical conductivity to the surface. Examples of this are the nickel-plating (with subsequent electrochemical chromium-plating) of plastic components in automotive construction and the chemical copper-coating of printed circuit boards for electrical and electronic equipment. Chemical metallization is carried out in a plurality of steps. In the case of chemical copper-coating of printed circuit boards (especially for through-hole plating), these steps are cleaning, etching the copper coating, the pre-dip for protecting the subsequent bath, activation with a palladium colloid or copper colloid, removal of excess colloid (also referred to as stripping) and finally the actual chemical copper-coating. In this procedure, a uniform and complete copper coating is desirable. Experience has shown that copper-coating of holes is sometimes accompanied by problems, where the copper sleeve chemically deposited in the holes has small holes or does not adhere to the base material of the printed circuit board in one or more areas (detachment from the hole wall), which leads to defective contacts when components are soldered in. Similar problems may also be encountered in the coating of nonmetallic surfaces with other metals. In chemical copper-coating and of course also in the case of other chemical metallization processes, it is therefore necessary to achieve a very high degree of freedom from pores and very good adhesion.

This is only ensured when the surface to be metallized can be uniformly coated with colloid during activation. For example, with glass fiber-reinforced epoxy resin boards, this is however frequently not the case since fibers of the laminate project into the hole, causing the formation of weak areas or even holes in the deposited copper.

Activation of the surface with a colloid can be improved if the article to be metallized is pretreated with a conditioner. The object of this conditioner is to improve the wettability of the surface and adsorptivity with respect to the colloid. The conditioner can be applied in the cleaner, in a separate bath afterward or in the pre-dip (bath prior to activation). It is most advantageously used in the cleaner.

Regarding the nature of the conditioner, a large number of proposals have already been made. For example, U.S. Pat. No. 3,684,572 envisages the use of a surfactant containing a quaternary amino group. British Patent Application No. 2,154,251 describes the use of an organic amine sensitizer; according to the Examples, this sensitizer is, in particular, (2,3-epoxypropyl)-trimethylammonium chloride or 2,3-dihydroxypropyl-trimethylammonium chloride, although the general formula also embraces certain low molecular weight derivatives of pyridine and imidazole in quaternized form. Finally, German Laid-Open Application DOS No. 3,530,617 discloses, as conditioners, quaternized heterocycles, such as imidazole or benzimidazole, which have a vinyl or allyl group on the nitrogen atom. The abovementioned conditioners have the disadvantage that their adsorption on the surface of the material to be metalized is not optimal and that those described in the last-mentioned publication are ethylenically unsaturated monomers which are toxic and must therefore be handled with particular care.

Cationic polymers, in particular those which have a polyacrylamide backbone with attached tetraalkylammonium groups, are recommended as conditioners in U.S. Pat. No. 4,478,883. We have found that polymers of this type have only a moderate action.

It is an object of the present invention to provide conditioners for pretreating nonmetallic materials for subsequent metallization, the said conditioners having optimum adhesion to the surface and, when properly produced, being very safe to handle.

We have found that this object is achieved by the use of the polymeric conditioners stated in the claims.

The substances to be used according to the invention are known or can be obtained in a known manner by condensing a di- or tri-(hydroxyalkyl)-amine, in particular one having a total of up to 10 carbon atoms in the hydroxyalkyl radicals, or a mixture of these, in the presence of a catalytic amount of a Lewis acid at elevated temperatures with elimination of water, and quaternizing the resulting condensate in a conventional manner, the amount of quaternizing agent being chosen so that the percentage of all nitrogen atoms in the polycondensates which is stated in the claims becomes quaternary.

Examples of suitable di- and tri-(hydroxyalkyl)-amines are diethanolamine, triethanolamine, methyldiethanolamine, butyldiethanolamine, diisopropanolamine and triisopropanolamine.

Preferably used starting materials are diethanolamine, triethanolamine and mixtures of these. For example, the following Lewis acids have proven useful as catalysts for the condensation: formic acid, oxalic acid and salts and esters of these acids; phosphorous and hypophosphorous acid and their ammonium and amine salts; halides, diesters, triesters, ester-amides and amides of phosphorous acid and of hypophosphorous acid. Phosphorous and hypophosphorous acid are preferred. The catalysts are advantageously used in an amount of from 0.1 to 1.0% by weight, based on the amine to be condensed.

A suitable condensation temperature has proven to be about 120°–280° C.

The polycondensates thus obtained are quaternized in a second reaction stage.

The quaternization can be carried out in a conventional manner, the usual quaternizing agents, for example alkyl or benzyl halides, such as butyl bromide, hexyl bromides, ethylhexyl bromide, n-octyl bromide, n-dodecyl bromide, benzyl bromide or the corresponding chlorides, being used.

Further information about the preparation of the polycondensates and their quaternization is given in, for example, German Laid-Open Application DOS No. 3,537,458 and German Published Applications DAS Nos. 1,127,084 and 1,243,874 (=British Patent No. 1,116,408).

From 10 to 99%, preferably from 30 to 90%, particularly preferably from 35 to 80%, of the nitrogen atoms of the polycondensate to be used according to the invention can be quaternized with $C_4$–$C_{12}$-alkyl groups and/or benzyl groups, provided that they are soluble in the aqueous bath used. The required solubility depends on the desired concentration for use. A solubility of 1% by weight or more in the bath is sufficient in all circumstances and is therefore preferred.

However, the type and extent of quaternization influence not only the solubility of the end products but also their particular suitability for interaction with certain activation colloids. The polycondensates described in claim 4 are suitable for pretreatment both before activation with palladium colloid and before activation with copper colloid.

The polycondensates to be used according to the invention are in the form of quaternary salts. Their quaternary nitrogen atoms can in principle be balanced by any acid anions, provided that they do not have an adverse effect on the solubility of the polymeric salts or, because of their own reactivity, give rise to problems during use. For the sake of simplicity, the polymeric salts contain, as a rule, the anions originating from the quaternizing agents which have been used in their preparation, i.e. preferably chloride or bromide ions.

The molecular weight of the polycondensates to be used according to the invention has no pronounced effect on their action. It may be assumed that molecular weights of about 500 or higher are sufficient. The use of particularly high molecular weight polycondensates has no advantages. Molecular weights of from 500 to $2.10^5$ are easily achieved in the polycondensation and are therefore preferred.

The polymeric conditioners described above are used, according to the invention, in a bath, in which the article to be metallized, for example a printed circuit board, is immersed. The article may also be sprayed with the solution of the conditioner. This solution is aqueous, i.e. it contains, as a solvent, either water alone or predominantly water as well as other water-miscible liquids, such as alcohols. Treatment of the nonmetallic article must be carried out before the activation with the palladium colloid or copper colloid, since it is otherwise ineffective. Use in the cleaning bath is most advantageous. In the other baths, there is a danger of damage to the conditioner (for example in the etching bath) or of an adverse effect on the solubility due to salts (for example in the pre-dip, an electrolyte-containing bath). Use in a wash bath would be uneconomical but is in principle possible.

The conditioner concentration required is from 0.001 to 1, preferably from 0.005 to 0.2, % by weight. The bath temperature should preferably be from 20° to 50° C. and the duration of use from 15 sec to 30 min, preferably from 2 to 10 min.

The conditioners to be used according to the invention are suitable for the pretreatment of a very wide variety of materials to be chemically metallized, for example articles of phenol resin/paper, epoxy resin, polystyrene, polyamide, polyethylene, polyvinyl chloride, polycarbonates, polyacrylates, polyesters, polysulfones or polytetrafluoroethylene, if necessary reinforced or filled with glass, minerals or polymers in fabric, fiber or other form, or of glass or ceramic material.

The Examples which follow illustrate the effectiveness of the novel use of the polymeric conditioners.

The test was carried out using a commercial chemical copper product line with palladium colloid activation and another line with copper colloid activation. The product lines each consist of:

| | |
|---|---|
| cleaner | |
| etching bath | (Etching the copper coating) |
| pre-dip | (Pretreatment for colloid activation) |
| activator | (Pd colloid or Cu colloid) |
| stripper | (Removal of excess colloid) |
| chemical copper bath | (Deposition bath) |

The intermediate wash baths are not contained in this list. The conditioner was added in each case to the cleaning bath, in a concentration of 0.15% by weight. The individual baths each had a volume of 50 ml (test tube in thermostated water bath). The temperatures, the treatment times and the washes between the baths corresponded to the manufacturer's specifications. The substrates used were:

pieces of woven glass fiber fabric, satin weave, basis weight 296 g/m², fixed at the edge with commercial adhesive.

Strips of glass fiber-reinforced epoxy resin printed circuit boards, FR4 (corresponding to Military Standard Mil-P-13949E, Class GFGF), laminated on both sides with copper foil and drilled.

The substrates were gently agitated in the bath during the treatment.

The glass fiber fabric pieces were each treated for 10 minutes in the deposition bath. After passing through the last wash bath, they were immersed in isopropanol and then dried with compressed air.

The pieces of printed circuit board were left in the deposition bath for 9 minutes in the product line operating with palladium colloid and for 7 minutes in that operating with copper colloid and were then dried with compressed air. This gave a thin copper coating having a relatively large number of defects (holes), but the effects of the conditioner were very easily detectable in the coating. The copper coating of the holes in the pieces of printed circuit board was tested on ground sections, which were examined under the microscope in transmitted light. This method is described, inter alia, in the annual Oberflächentechnik 40 (1984), 122-133 (H.-J. Ehrich: Vorteile der alkalischen Aktivierung zur Herstellung hochwertiger Leiterplatten).

The copper-coated substrates were evaluated on the basis of ratings:

| Rating | Evaluation |
|---|---|
| 0 | No deposit |
| 1 | Very poor (only partial deposition) |
| 2 | Poor (considerable passage of light) |
| 3 | Moderate |
| 4 | Satisfactory (Suitable for production) |
| 5 | Good (few holes or passage of light) |
| 6 | Very good (no holes or passage of light) |

It should once again be pointed out here that the intentionally thin copper coating results in poor absolute ratings when the pieces of printed circuit board are tested. The action of the conditioners is obtained in this case from the difference between the ratings.

The following polymeric conditioner was tested:

I. A condensate of di- and triethanolamine (molar ratio 1:1), 80% quaternized, based on N, with benzyl chloride and prepared by condensation of the above-mentioned amines at 210° C. in the course of 7 hours in the presence of hypophosphorous acid followed by quaternization in 70% by weight of water/30% by weight of ethanol at 25° C. in the course of 6 hours. After the quarternization, the ethanol was removed by distillation.

| Example No. | Condi- tioner | Colloid Pd | Colloid Cu | Substrate Glass | Substrate Circuit board | Rating | Action = difference between ratings |
|---|---|---|---|---|---|---|---|
| Comp. 1 | — | X | | X | | 3 | — |
| 1 | I | X | | X | | 4–5 | 1.5 |
| Comp. 2 | — | | X | X | | 3–4 | — |
| 2 | I | | X | X | | 6 | 2.5 |
| Comp. 3 | — | | X | | X | 2–3 | — |
| 3 | I | | X | | X | 4 | 1.5 |

In another test series, the above procedure was followed, except that, instead of the cleaning bath used in Examples 1 to 4 and Comparative Examples 1 to 3 and supplied to the product line, a cleaning bath having the following composition was used:

1 5% by weight of nonylphenol oxyethylate (14EO),
0.6% by weight of triethanolamine,
0.02% by weight of polyvinylpyrrolidone having a K value of 30 and
0.04% by weight of sodium hydrogen phosphate, the remainder to 100% by weight being water.

In Comparative Example 4, no conditioner was added to this bath, while in Comparative Examples 5 and 6 and the novel Example 4 0.5% by weight of the following conditioner was used in each case:

Comparison 5: II. Copolymer of 30% by weight of acrylamide and 70% by weight of (2-acryloyloxyethyl)-trimethylammonium chloride (corresponding to U.S. Pat. No. 4,478,883);

Comparison 6: III. Copolymer of 50% by weight of acrylamide and 50% by weight of (2-acryloyloxyethyl)-trimethylammonium chloride (corresponding to U.S. Pat. No. 4,478,883);

Example 4: IV. Condensate prepared similarly to the abovementioned product I, but 80% quaternized, based on N, with n-octyl bromide.

The deposition time in the chemical copper bath was 15 minutes.

The Table below shows that Example 4 carried out according to the invention gives substantially better results than Comparative Examples 5 and 6 carried out according to U.S. Pat. No. 4,478,883.

| Example No. | Condi- tioner | Colloid Pd | Substrate Glass | Rating | Action = difference between ratings |
|---|---|---|---|---|---|
| Comp. 4 | — | X | X | 0–1 | — |
| Comp. 5 | II | X | X | 1 | 0.5 |
| Comp. 6 | III | X | X | 1–2 | 1 |
| 4 | IV | X | X | 3–4 | 3 |

We claim:

1. A process for the chemical metallization of the nonmetallic surface of a molding, which comprises the following steps:
   (a) cleaning said surface;
   (b) activating said surface with a metal colloid dispersed in an aqueous medium;
   (c) stripping excess colloid from said surface; and
   (d) chemically depositing a metal on said surface, and wherein, at any time prior to process step (b), said surface is treated with a conditioner which is one or more quaternary salts of a polycondensate of an amine in aqueous solution, wherein said amine is at least one member selected from the group consisting of di-(hydroxyalkyl)-amines and tri-(hydroxyalkyl)-amines, and wherein from 10 to 99% of the nitrogen atoms of said polycondensate are quaternized with a C4–C12-alkyl group or a benzyl group.

2. The process of claim 1, wherein said conditioner is a salt of a polycondensate wherein from 30 to 90% of the nitrogen atoms are quaternized.

3. The process of claim 1, wherein said conditioner is a salt of a polycondensate of diethanolamine, triethanolamine or a mixture of these amines.

4. The process of claim 1, wherein said conditioner is a salt of a polycondensate wherein from 35 to 80% of the nitrogen atoms are quaternized with n-octyl or benzyl groups.

5. The process of claim 3, wherein said conditioner is a salt of a polycondensate wherein from 35 to 80% of the nitrogen atoms are quaternized with n-octyl or benzyl groups.

6. The process of claim 1, wherein said surface is treated for from 15 seconds to 30 minutes with an aqueous solution which contains from 0.001 to 1% by weight of said conditioner and is at a temperature of 10°–60° C.

7. The process for the chemical metallization of the nonmetallic surface of a molding with a metal layer present on a portion of said surface, which comprises the following steps:
   (a) cleaning said surface;
   (b) etching said metal layer present on a portion of said surface;
   (c) activating said surface with a metal colloid dispersed in an aqueous medium;
   (d) stripping excess colloid from said surface; and
   (e) chemically depositing a metal on said surface, and wherein, at any time prior to process step (c), said surface is treated with a conditioner which is one or more quaternary salts of a polycondensate of an amine in aqueous solution, wherein said amine is at least one member selected from the group consisting of di-(hydroxyalkyl)-amines and tri-(hydroxyalkyl)-amines, and wherein from 10 to 99% of the nitrogen atoms of said polycondensate are quaternized with a C4–C12-alkyl group of a benzyl group.

8. The process of claim 7, wherein said conditioner is a salt of a polycondensate wherein from 30 to 90% of the nitrogen atoms are quaternized.

9. The process of claim 7, wherein said conditioner is a salt of a polycondensate of diethanolamine, triethanolamine or a mixture of these amines.

10. The process of claim 7, wherein said conditioner is a salt of a polycondensate wherein from 35 to 80% of the nitrogen atoms are quaternized with n-octyl or benzyl groups.

11. The process of claim 9, wherein said conditioner is a salt of a polycondensate wherein from 35 to 80% of the nitrogen atoms are quaternized with n-octyl or benzyl groups.

12. The process of claim 7, wherein said surface is treated for from 15 seconds to 30 minutes with an aqueous solution which contains from 0.001 to 1% by weight of said conditioner and is at a temperature of 10°–60° C.

* * * * *

UNITED STATES PATENT AND TRADEMARK OFFICE
CERTIFICATE OF CORRECTION

PATENT NO. : 4,940,609

DATED : Jul. 10, 1990

INVENTOR(S) : Chung-Ji Tschang, et al.

It is certified that error appears in the above-identified patent and that said Letters Patent is hereby corrected as shown below:

On the title page, insert the following:

--[30]     Foreign Application Priority Data
    Dec. 23, 1987  [DE]  Fed. Rep. of Germany .......3743743--

Signed and Sealed this

Third Day of September, 1991

*Attest:*

HARRY F. MANBECK, JR.

*Attesting Officer*     *Commissioner of Patents and Trademarks*